United States Patent
Berestesky et al.

(10) Patent No.: US 7,155,385 B2
(45) Date of Patent: Dec. 26, 2006

(54) AUTOMATIC GAIN CONTROL FOR ADJUSTING GAIN DURING NON-SPEECH PORTIONS

(75) Inventors: Alexander Berestesky, Ashland, MA (US); David E. Duehren, Needham, MA (US)

(73) Assignee: Comerica Bank, as Administrative Agent, San Jose, CA (US)

( * ) Notice: Subject to any disclaimer, the term of this patent is extended or adjusted under 35 U.S.C. 154(b) by 767 days.

(21) Appl. No.: 10/146,742

(22) Filed: May 16, 2002

(65) Prior Publication Data

US 2003/0216908 A1 Nov. 20, 2003

(51) Int. Cl.
G10L 11/02 (2006.01)
G10L 21/02 (2006.01)
G10L 15/20 (2006.01)

(52) U.S. Cl. .................. 704/215; 704/225; 704/228
(58) Field of Classification Search ................ 704/210, 704/215, 225, 233, 226, 228; 341/139; 381/107
See application file for complete search history.

(56) References Cited

U.S. PATENT DOCUMENTS

| | | | | |
|---|---|---|---|---|
| 4,747,143 A * | 5/1988 | Kroeger et al. | ............. | 704/225 |
| 4,777,649 A * | 10/1988 | Carlson et al. | ............. | 704/225 |
| 5,035,242 A | 7/1991 | Franklin et al. | | |
| 5,146,504 A | 9/1992 | Pinckley | | |
| 5,165,017 A * | 11/1992 | Eddington et al. | .......... | 381/321 |
| 5,267,322 A | 11/1993 | Smith et al. | | |
| 5,583,969 A * | 12/1996 | Yoshizumi et al. | ......... | 704/225 |
| 5,592,545 A | 1/1997 | Ho et al. | | |
| 5,666,384 A | 9/1997 | Kuban et al. | | |
| 5,680,075 A * | 10/1997 | Sacca | ......................... | 330/279 |
| 5,838,269 A * | 11/1998 | Xie | ............................. | 341/139 |
| 5,854,845 A * | 12/1998 | Itani | ............................. | 381/108 |
| 6,169,971 B1 | 1/2001 | Bhattacharya | | |
| 6,266,632 B1 * | 7/2001 | Kato et al. | ................... | 704/219 |
| 6,308,155 B1 | 10/2001 | Kingsbury et al. | | |
| 6,314,396 B1 | 11/2001 | Monkowski | | |
| 6,321,194 B1 * | 11/2001 | Berestesky | .................. | 704/232 |
| 6,351,529 B1 | 2/2002 | Holeva | | |
| 6,351,731 B1 * | 2/2002 | Anderson et al. | ........... | 704/233 |
| 6,363,343 B1 * | 3/2002 | Horos | ......................... | 704/225 |
| 6,370,500 B1 * | 4/2002 | Huang et al. | ............... | 704/208 |
| 6,604,071 B1 * | 8/2003 | Cox et al. | .................... | 704/225 |
| 6,651,040 B1 * | 11/2003 | Bakis et al. | ................. | 704/225 |
| 6,862,567 B1 * | 3/2005 | Gao | ............................. | 704/228 |
| 6,937,978 B1 * | 8/2005 | Liu | .............................. | 704/228 |
| 2004/0172242 A1 * | 9/2004 | Seligman et al. | ........... | 704/225 |

FOREIGN PATENT DOCUMENTS

DE 4031638 4/1991
DE 43 15677 11/1994

(Continued)

OTHER PUBLICATIONS

Mercy, D.V., "A Review of Automatic Gain Control Theory", *The Radio and Electronoc Engineer*, vol. 51, No. 11/12/, pp. 579-590; 1981, 3 pages.

(Continued)

Primary Examiner—Martin Lerner
(74) Attorney, Agent, or Firm—Fish & Richardson P.C.

(57) ABSTRACT

An estimate is made of the power of a speech portion of a speech signal that includes speech portions separated by non-speech portions, the power for the speech portion being estimated based on a power envelope that spans the speech portion. The gain of an automatic gain control is not adjusted during the speech portions.

23 Claims, 6 Drawing Sheets

FOREIGN PATENT DOCUMENTS

| | | |
|---|---|---|
| EP | 0 248609 | 12/1987 |
| EP | 0 836310 | 4/1998 |
| JP | 59-116797 | 7/1984 |
| JP | 59-116798 | 7/1984 |
| JP | 4-367899 | 12/1992 |
| JP | 8-256029 | 10/1996 |
| WO | WO 88/08227 | 10/1988 |
| WO | WO 00/43988 | 7/2000 |
| WO | WO 01/39546 | 5/2001 |

OTHER PUBLICATIONS

Lovrich, A. and Chirayil, R., "An All-Digital Automatic Gain Control", *Digital Signal Processor Products-Semiconductor Group, Texas Instruments*, vol. 2, pp. 389-403; 1990, 6 pages.

Oppenheim, A.V, and Shafer, R.W., "Digital Signal Processing", Prentice-Hall., Englewood Cliffs, New Jersey, 1975, 4 pages.

\* cited by examiner

AUTOMATIC GAIN CONTROL FOR ADJUSTING GAIN DURING NON-SPEECH PORTIONS

BACKGROUND

This description relates to automatic gain control.

Automatic gain control (AGC) is used to maintain an output signal level nearly constant notwithstanding variations of an input signal level within a predefined dynamic range The input signal may be, for example, a signal received from a telephone channel.

As shown in FIG. 1, a telephone channel can be characterized as having a frequency response $H(j\omega)$ and an attenuation A:

$$0 < |H(j\omega)| < 1 (0 < \omega < 4(\text{kHz})) \text{ and } A <= 1).$$

As shown in FIG. 2, a goal of AGC is to maintain the output signal level 20 at almost a constant value, even though the input signal may change within a predefined range 22 between X1 and X2.

When the signal carried on the telephone channel is a modulated data signal, the dynamic range of the signal is typically within the capacity of the AGC, e.g., within range 22. A speech signal, on the other hand, may have a wide dynamic range that changes over time. A conventional AGC tries to keep the power of the signal constant, thus distorting the speech.

The AGC process can be defined in the following way. Consider a sampled input signal $x(n)$, where n identifies the sample interval, and the input signal spans a time interval of N samples (n=0 ... N−1). The gain of the AGC, which changes over time may be expressed as $g(n)$ (n=0 ... N−1). The output of the AGC may then be expressed as:

$$y(n) = x(n)g(n), n=0 \ldots N-1 \quad (1)$$

Expression (1) can be interpreted as a weighting of the original signal $x(n)$ by the samples of $y(n)$, which plays the role of a window function. In this case the spectrum of $y(n)$ is a result of the convolution:

$$Y(w) = X(w) * G(w) \quad (2)$$

where:
w is the frequency in radians,
Y(w) is the spectrum of the signal at the output of the AGC,
X(w) is the Fourier transform of the input signal for the interval N, and
G(w) is the Fourier transform of the AGC gain function for the interval N.

SUMMARY

In general, in one aspect, the invention features a method that includes (a) performing automatic gain control on portions of a speech signal that includes speech portions separated by non-speech portions, and (b) controlling the gain of the automatic gain control differently depending on whether the portions are speech portions or non-speech portions.

In general, in another aspect, the invention features a method that includes (a) estimating power of a speech portion of a speech signal that includes speech portions separated by non-speech portions, the power for the speech portion being estimated based on a power envelope that spans the speech portion, and (b) refraining from adjusting the gain of an automatic gain control during the speech portions.

Implementations of the invention may include one or more of the following features. Each of the non-speech portions comprises silence. Each of the speech portions comprises a speech signal, e.g., a word. For each of the speech portions, the gain is controlled to be constant. The gain is controlled during non-speech portions. The estimating includes estimating a power of the speech signal separately for each of the speech portions. The estimating includes an averaging of the estimated powers of the speech portions. The estimating includes detecting a maximum power that occurs during each of the speech portions. Voice activity is detected as an indication of the start of each portion of the signal.

In general, in another aspect, the invention features a method that includes (a) estimating power of a speech portion of a speech signal that includes speech portions separated by non-speech portions, the power for the speech portion being estimated based on a power envelope that spans the speech portion, and (b) controlling an automatic gain control based on the power estimate.

Implementations of the invention may include one or more of the following features. Estimating the power for each of the speech portions includes estimating a peak power level. The estimating includes an averaging process. A presence or absence of voice activity is detected as an indication of the boundaries of the speech and non-speech portions. A gain of an AGC is adjusted based on the estimating of the power of the speech signal.

In general, in another aspect, the invention features an apparatus that includes (a) a port to receive a speech signal and (b) an automatic gain control configured to apply a constant gain to a speech portion of the signal and to adjust the gain during non-speech portions of the signal based on power estimates done during a previous speech portion.

Implementations of the invention may include one or more of the following features. The automatic gain control includes power estimating elements configured to generate an estimate of a power of the speech portions of the speech signal. The automatic gain control includes voice activity detection elements.

In general, in another aspect, the invention features a system comprising (a) a port to receive speech signals, (b) an automatic gain control configured to estimate power of a speech portion of a speech signal that includes speech portions separated by non-speech portions, the power for the speech portion being estimated based on a power envelope that spans the speech portion, and refrain from adjusting the gain of an automatic gain control during the speech portions, and (c) elements configured to perform speech functions based on an output of the automatic gain control. The system may be embodied in a multi-channel voice processing board.

Among the advantages of the invention are one or more of the following. Optimal gain for a continuous speech signal is achieved without introducing non-linear distortion. The result is higher fidelity speech in interactive voice response (IVR) and automatic speech recognition (ASR) applications. The implementation can be simple.

Other advantages and features will become apparent from the following description and from the claims.

DETAILED DESCRIPTION OF PREFERRED EMBODIMENTS

In general, computation of the convolution (expression 2) causes the emergence of new spectral components that were not present in the original signal x(n) and that indicate the presence of non-linear distortions.

However, there are two trivial cases for which non-linear distortions will not occur:

Case 1. g(n) is constant for the interval N. In this case:

$$Y(w)=CX(w),$$

that is, the input signal undergoes only a constant change in level.

Case 2. x(n)=0, n=0 . . . N−1, which means that the input signal is only silence.

Combining 1 and 2 yields a principle that can be used to create a non-distorting AGC: change the AGC gain only when the input signal is not present, and, when the input signal is present, keep the gain constant and perform the estimate of the speech loudness.

This approach is well suited to speech signals in which typically 10% to 20% of the signal is silence (e.g., in the form of pauses between the words), but it can be used in other situations also.

Figure 1:
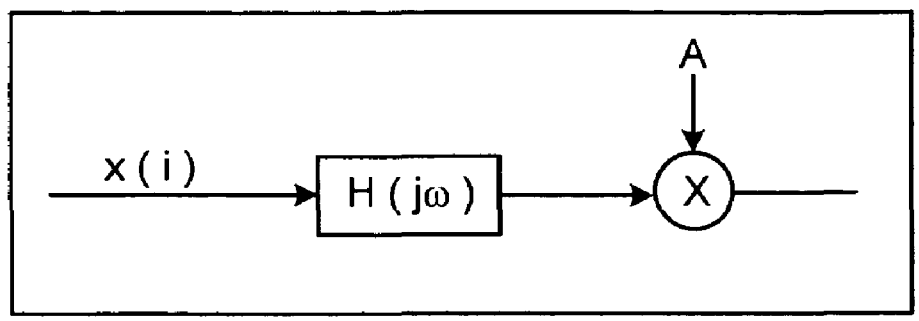
FIG. 1 is a block diagram of a signal received from a telephone channel.
Figure 2:
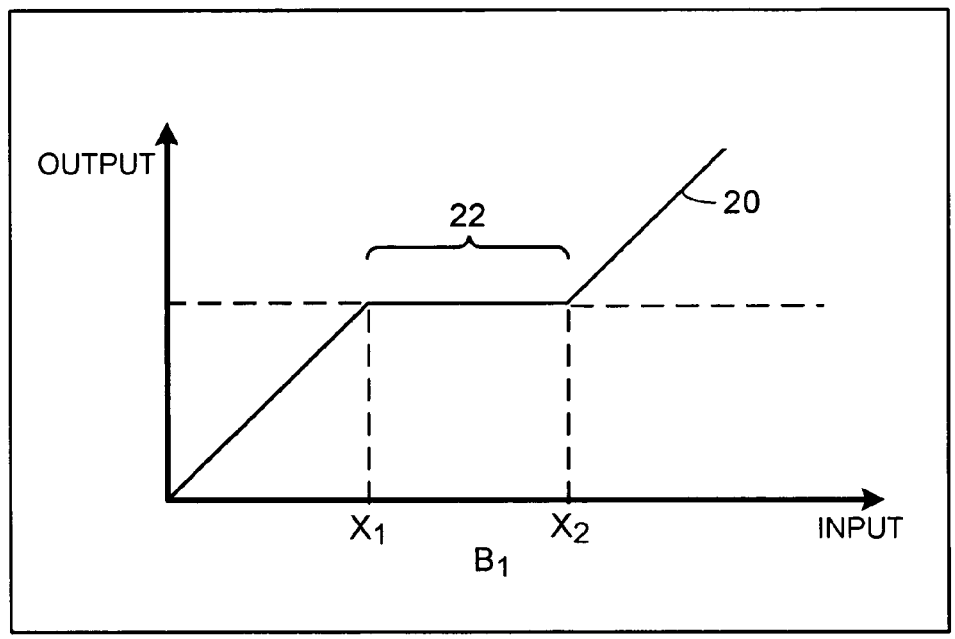
FIG. 2 is a graph of output versus input of a signal received from a telephone channel.
Figure 3:
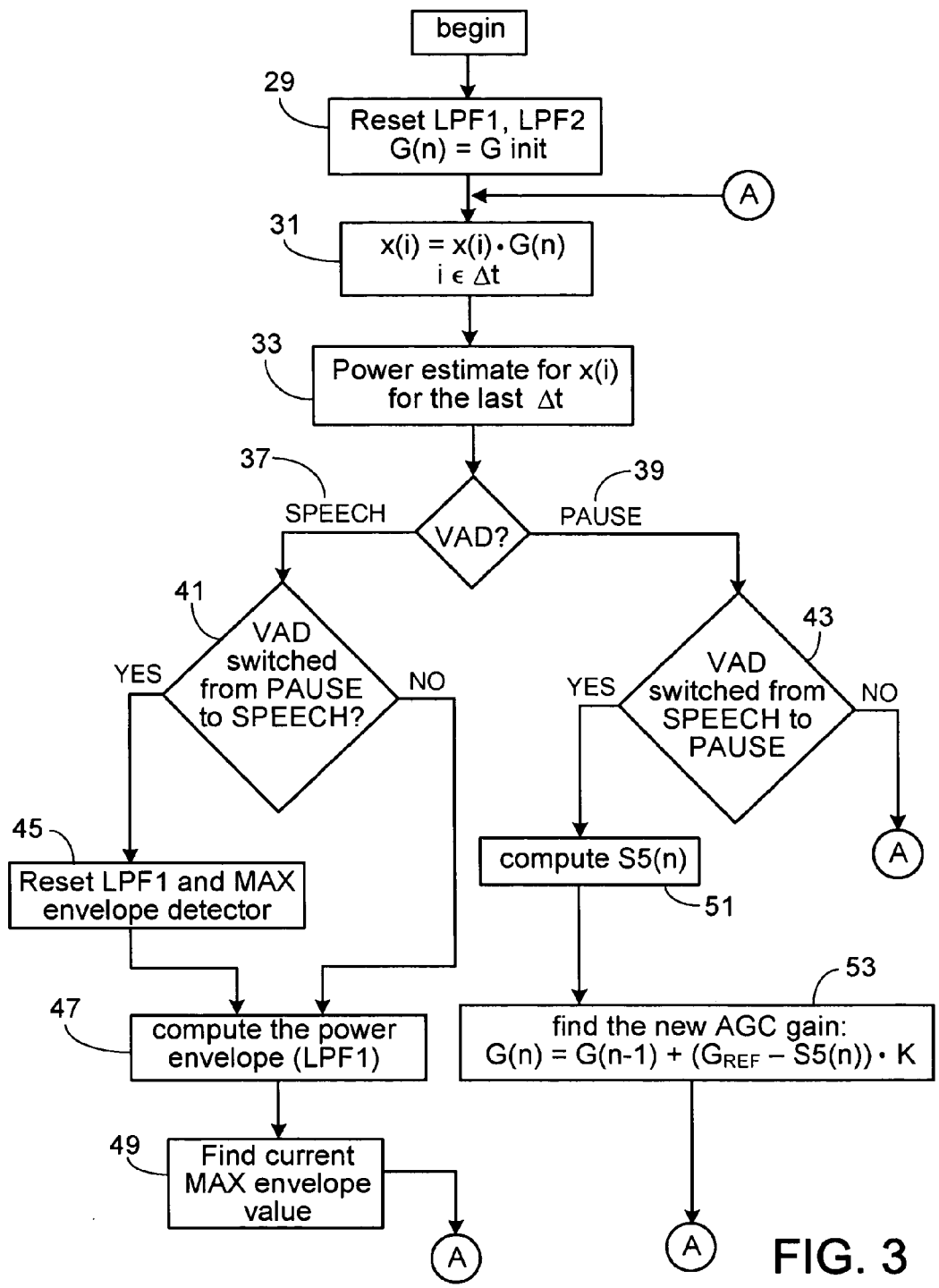
FIG. 3 is a flow chart of a process for automatic gain control.
Figure 4:
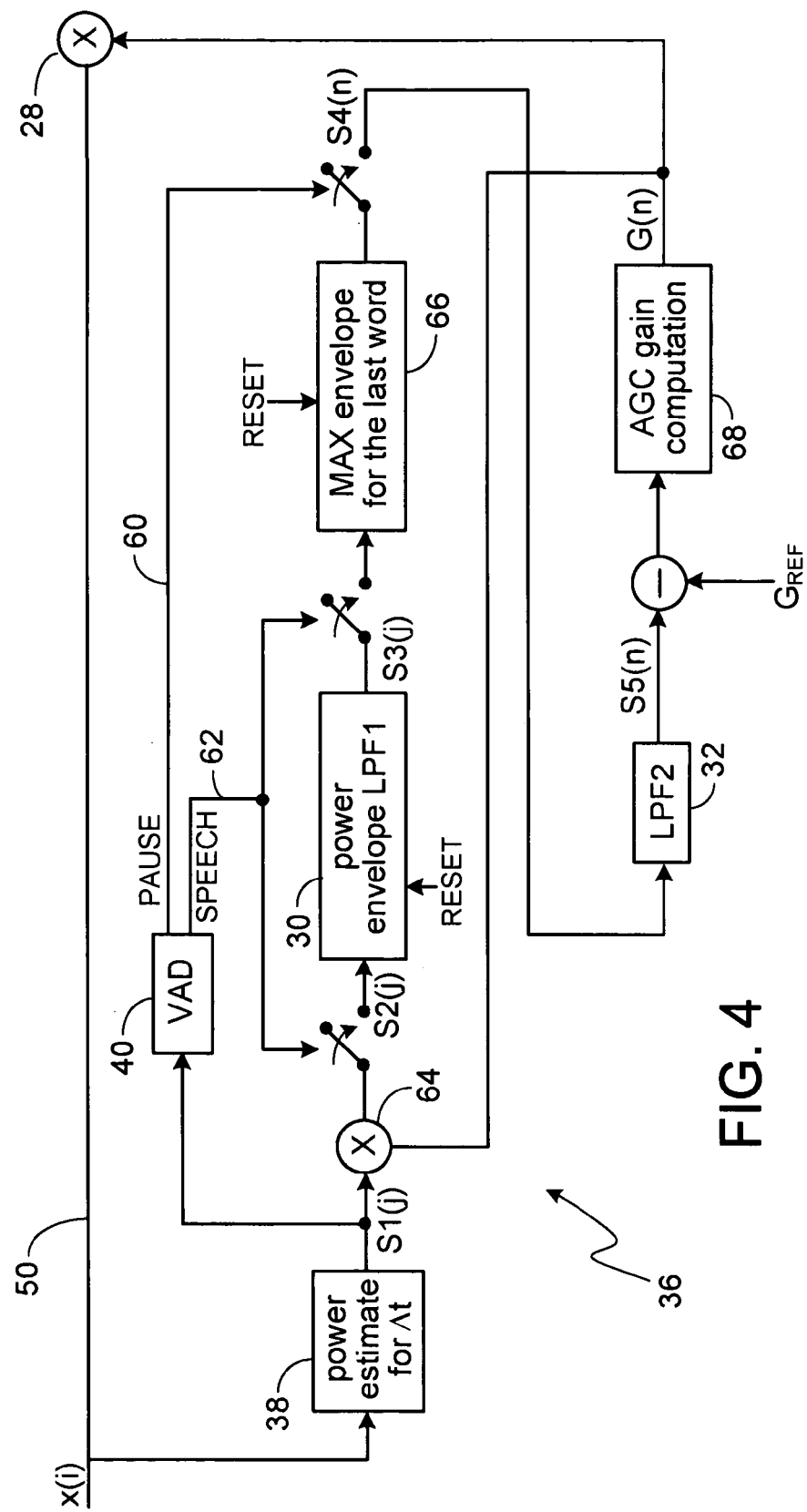
FIG. 4 is a block diagram of a circuit arrangement.
Figure 5:
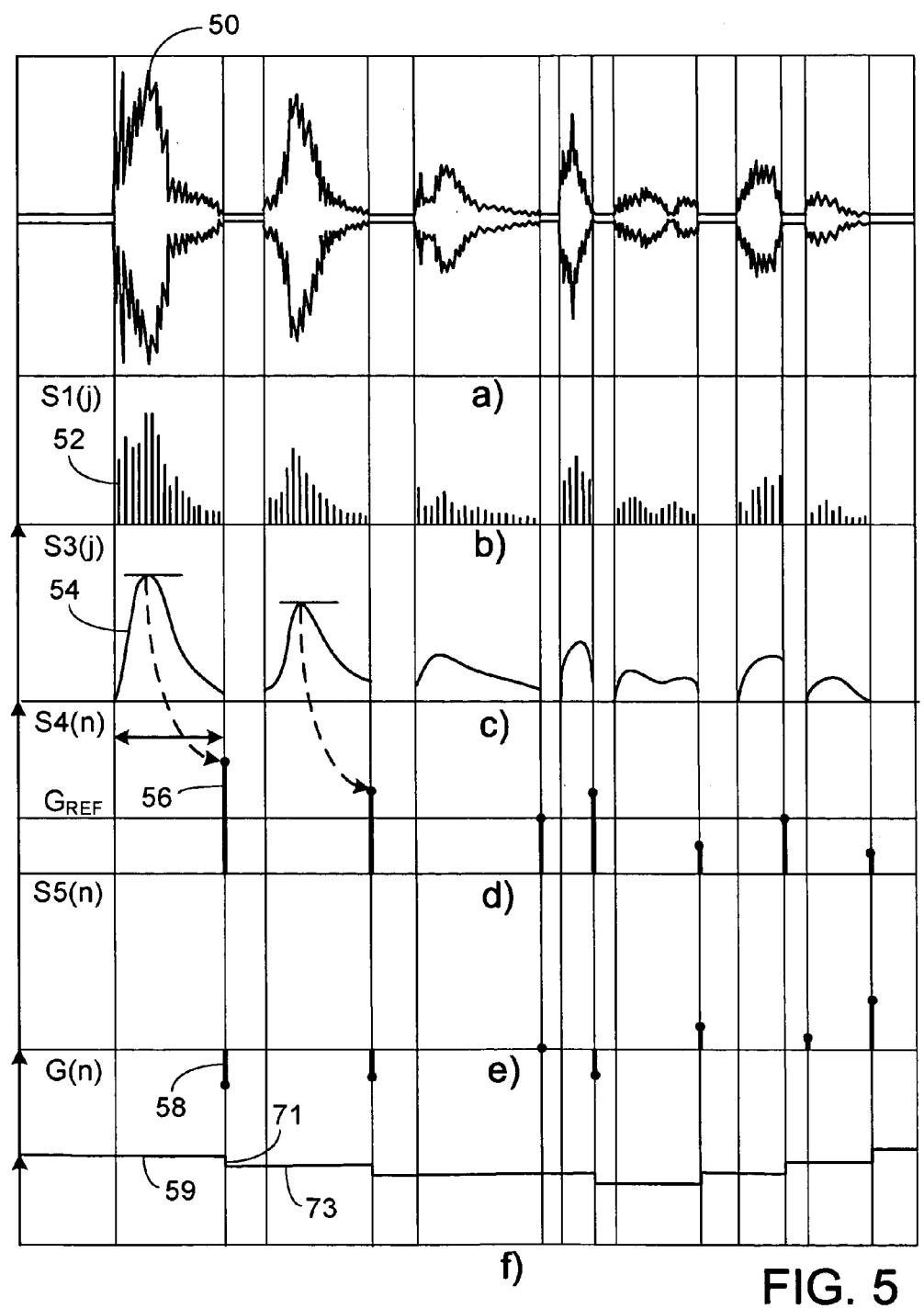
FIG. 5 is a timing chart relating to a circuit arrangement.

A flow diagram of an example process for AGC is shown in FIG. 3. A circuit arrangement is shown in FIG. 4. And timing diagrams related to the circuit are shown in FIG. 5. Other processes and other circuit arrangements could be used also.

As shown in FIG. 4, the incoming signal 50 (shown at the top of FIG. 5) is sampled every 125 microseconds, for example, to generate samples x(i) where i is the index of the input sample. Based on the samples x(i), the AGC 26 (FIG. 4) generates a series of gain values G(n) which are multiplied in element 28 by the incoming speech signal samples x(i) to produce gain adjusted signals for use later, for example, in automated speech recognition or interactive voice response.

At the beginning of the process, the gain values G(n) and low pass filters 30, 32 are initialized (step 29, FIG. 3). Each sample x(i) that occurs within a time interval Δt of, say, 5 milliseconds is multiplied 31 by a current gain value G(n) in the multiplication element 28 (FIG. 4).

Then the following steps are performed.

Step 1: A power estimation 33 is performed in element 38 with respect to the samples x(i) that appeared in the most recent Δt interval. The power estimation is performed by summing over the interval Δt the absolute values of those samples to form a value S1(j), where j is the index of the 5 ms interval:

$$S1(j)=\Sigma|x(i)|, \Delta t=5\ ms$$

Thus, the power estimator 38 generates a sequence of values 52 (FIG. 5) spaced at intervals of Δt, each of the values representing the level of the signal in the samples that appeared in the interval that just ended.

Step 2: A voice activity detector (VAD 40) then decides 35 whether the value S1(j) represents speech 37 or silence 39. The state of the VAD (speech or silence) remains unchanged until a sequence of values S1(j) appears that would signal a switch from pause to speech 41 (because a period of pause has just been ended by the beginning of speech) or from speech to pause 43 (because a period of speech has just been ended by the beginning of silence). The VAD has two outputs 60, 62. Output 60 is triggered when the VAD state changes to pause. Output 62 is triggered when the VAD state changes to speech.

When the VAD switches to the speech state, the low pass filter 30 is reset 45 as is a maximum envelope detector 66. Thereafter, until the state switches back to silence, the power estimates S1(j) are multiplied in an element 64 by the current value of the AGC gain (G(n)) and passed to the input of the low pass filter 30. The low pass filter in effect determines 47 the power envelope 54 of the input signal.

Conversely, if the VAD detects 39 the start of a pause (in effect, the end of the current word), step 4, below, is performed.

Step 3: While the VAD is in the speech state, the successive outputs of the low pass filter 30 (S3(j)) are passed through a maximum envelope generator 66 which produces 49, after a word has been completed, a signal S4(n) representing the maximum 56 of the envelope of the power estimates for the most recent utterance, e.g., word, where n is the index of an utterance (e.g., a period of speech that is sandwiched between a preceding period of silence and a following period of silence.) The maximum of the power envelope is used as an estimate of the "loudness" of the word. The process returns to step 1 for each successive interval Δt during a word segment.

Step 4: When the end of the current word is detected, the value of S4(n) is computed as:

$$S4(n)=\max(S3(j)),$$

where S4(n) is an estimate of the "loudness" for the word n, j∈Tn, where Tn is the duration of the $n^{th}$ word.

S4(n) is passed to the input of low-pass filter 32, which performs 51 a weighted averaging of S4(n) for all words detected over a period of time. LPF2 is implemented as a first-order infinite impulse response (IIR) filter. The output of the LPF2, S5(n), is an estimate of the loudness of the speech after n words have been detected.

Step 5: The estimate of the loudness of the incoming speech S5(n) is compared 53 to a reference value for loudness, Gref, and the new AGC gain is computed by a gain computation element 68 as follows:

$$G(n)=G(n-1)+(Gref-S5(n))*k,$$

where k=constant<<1. In effect, the prior gain is updated by a small fraction (k) of the amount by which the average maximum envelope power (S5(n)) differs from a reference level (Gref).

The process then returns to step 1.

The gain value for the nth word G(n) is multiplied by the input samples x(i) for that word to produce the samples of the gain-revised signal.

The gain level G(n) 59 is thus updated at the beginning 71 of each period of silence, and is kept constant during other periods 73 including during speech.

In the algorithm, the loudness of speech is defined on a word-by-word basis rather than on the basis of power measurement for separate sounds which form an utterance. The loudness of each word is defined in terms of the maximum of the power envelope for that word.

The gain is not changed (is kept constant) with respect to all of the samples for a word. As explained earlier, the speech will not be distorted by the AGC process if the gain is not changed during speech. Rather, the gain is changed during the pause after each word.

The algorithm does not require an especially accurate (or complex) VAD. All that is needed is to define the maximums of the power envelopes for separate words and the presence of the pause, to perform the update of the S3, S4, S5. If the VAD does not detect the start of the utterance accurately, the algorithm may miss the first soft sounds of the utterance. But the algorithm will not miss the loud part which defines the maximum level that is being sought. Conversely, if the VAD misses the start of the non-speech interval, the gain adjustment may be performed a little later during the pause, which is not a problem because the gain can be adjusted at any time during the pause. Thus, the VAD can be implemented in a simple way according to the following rule: If the power estimate for a 5 ms interval exceeds a threshold T, N times in a row, the VAD determines that a speech interval has begun. If the power estimate drops below the threshold T, N times in a row, the VAD determines that a non-speech interval (pause) has begun.

The AGC compensates for the speech attenuation introduced by the channel without distorting the speech signal. Tests have demonstrated that the algorithm has a robust performance over a variety of different speakers and channel conditions.

The AGC algorithm may be implemented in hardware, software, or a combination of them. One implementation is embedded firmware for a multichannel voice processing board used for interactive voice response (IVR), based on a Texas Instruments TI549 digital signal processor requiring only a small portion of the processing capability (e.g., less than 0.25 MIPs).

Figure 6:
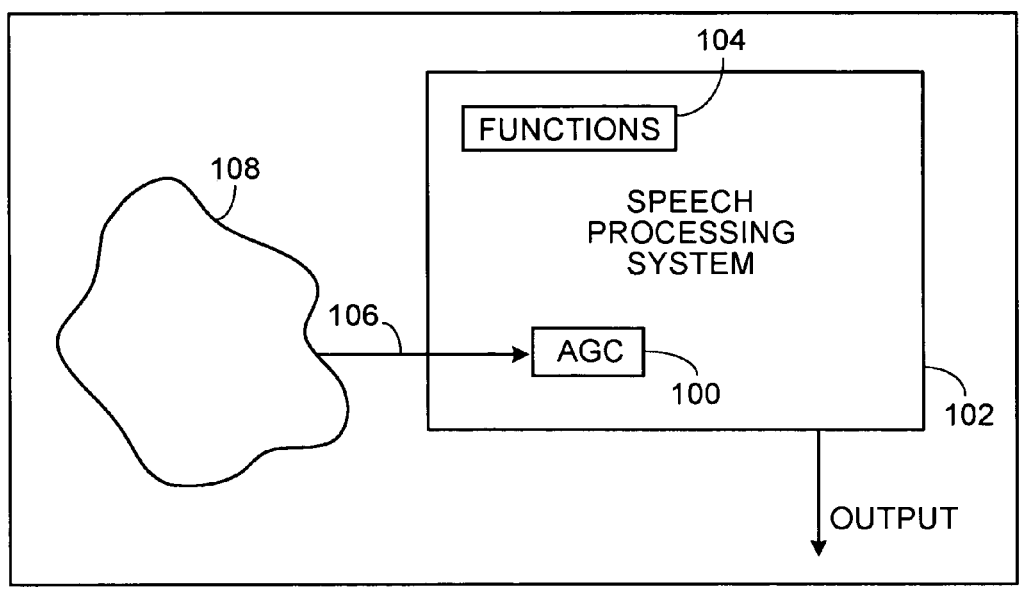
FIG. 6 is a block diagram of a speech processing system.

As shown in FIG. 6, more generally, the AGC can be implemented as part of a wide variety of speech processing systems 102 that provide any possible speech-related function 104. The speech signal 106 that is the input to the AGC may be received from any source 108 including a telephone line, the internet, a local area or wide area network or an internal bus or line within another system.

Although we have described certain implementations, other implementations are also within the scope of the following claims.

The invention claimed is:

1. A method comprising
   estimating power of a speech portion of a speech signal that includes speech portions separated by non-speech portions, the power for the speech portion being estimated based on a power envelope that spans the speech portion, and
   refraining from adjusting the gain of an automatic gain control during the speech portions.

2. The method of claim 1 in which each of the non-speech portions comprises silence.

3. The method of claim 1 in which the each of the speech portions comprises a word.

4. The method of claim 1 in which, for each of the speech portions, the gain is controlled to be constant.

5. The method of claim 1 in which the gain is controlled so as to be adjusted during non-speech portions.

6. The method of claim 1 in which the estimating includes estimating a power of the speech signal separately for each of the speech portions.

7. The method of claim 6 in which the estimating includes averaging the estimated powers of the speech portions.

8. The method of claim 1 in which the estimating includes detecting a maximum power that occurs during each of the speech portions.

9. The method of claim 1 also including detecting voice activity as an indication of the start of each portion of the signal.

10. A method comprising
    detecting voice activity as an indication of the start of each portion of a speech signal, the speech signal including word portions separated by pause portions,
    estimating power for the word portions, and
    controlling the gain of an automatic gain control to be constant for the duration of the word portions and to be adjusted, based on the estimated power, during the pauses between the words.

11. A method comprising
    estimating power of a speech portion of a speech signal that includes speech portions separated by non-speech portions, the power for the speech portion being estimated based on a power envelope that spans the speech portion, and
    controlling an automatic gain control to be adjusted during the non-speech portions based on the power estimate.

12. The method of claim 11 in which estimating the power for each of the speech portions comprises estimating a peak power level.

13. The method of claim 11 in which the estimating includes averaging the power estimates for the speech portions of the signal.

14. The method of claim 11 also including detecting a presence or absence of voice activity as an indication of the boundaries of the speech and non-speech portions.

15. The method of claim 11 also including adjusting a gain of an AGC based on the estimating of the power of the speech signal.

16. Apparatus comprising
    a port to receive a speech signal, and
    an automatic gain control configured to apply a constant gain to a speech portion of the signal and to adjust the gain during non-speech portions of the signal based on power estimates done during previous speech portions.

17. The apparatus of claim 16 in which the automatic gain control includes power estimating elements configured to generate an estimate of a power of the speech portions of the speech signal.

18. The apparatus of claim 16 in which the automatic gain control includes voice activity detection elements.

19. A medium carrying instructions capable of causing a machine to estimate power of a speech portion of a speech signal that includes speech portions separated by non-speech portions, the power for the speech portion being estimated based on a power envelope that spans the speech portion, and
    refrain from adjusting the gain of an automatic gain control during the speech portions.

20. The medium of claim 19 embodied as firmware associated with a digital signal processing chip.

21. A system comprising
    a port to receive speech signals,
    an automatic gain control configured to estimate power of a speech portion of a speech signal that includes speech portions separated by non-speech portions, the power for the speech portion being estimated based on a power envelope that spans the speech portion, and refrain from adjusting the gain of an automatic gain control during the speech portions, and elements configured to perform speech functions based on an output of the automatic gain control.

22. The system of claim 21 embodied in a multi-channel voice processing board.

23. Apparatus comprising means for estimating power of a speech portion of a speech signal that includes speech portions separated by non-speech portions, the power for the speech portion being estimated based on a power envelope that spans the speech portion, and means for refraining from adjusting the gain of an automatic gain control during the speech portions.

* * * * *